United States Patent [19]
Breton

[11] Patent Number: 4,857,845
[45] Date of Patent: Aug. 15, 1989

[54] METHOD FOR THE APPLICATION OF GRADIENT PULSES IN AN IMAGING EXPERIMENT USING A NUCLEAR MAGNETIC RESONNANCE MACHINE

[75] Inventor: Eric Breton, Voisin le Bretonneux, France

[73] Assignee: General Electric CGR SA, Issy Les Moulineaux, France

[21] Appl. No.: 180,111

[22] PCT Filed: Jul. 28, 1987

[86] PCT No.: PCT/FR87/00299
§ 371 Date: Mar. 22, 1988
§ 102(e) Date: Mar. 22, 1988

[87] PCT Pub. No.: WO88/01381
PCT Pub. Date: Feb. 25, 1988

[30] Foreign Application Priority Data
Aug. 14, 1986 [FR] France .................. 86 11730

[51] Int. Cl.⁴ .......................... G01R 33/20
[52] U.S. Cl. ........................ 324/309; 324/307
[58] Field of Search ............ 324/300, 307, 309, 310, 324/311, 312, 314, 318, 322

[56] References Cited
U.S. PATENT DOCUMENTS

| | | | |
|---|---|---|---|
| 4,644,281 | 2/1987 | Savelainen | 324/320 |
| 4,689,560 | 8/1987 | Nayler et al. | 324/309 |
| 4,701,705 | 10/1987 | Rollwitz | 324/307 |
| 4,707,660 | 11/1987 | Cuppen | 324/307 |

FOREIGN PATENT DOCUMENTS

| | | |
|---|---|---|
| 0076400 | 4/1983 | European Pat. Off. . |
| 0132975 | 2/1985 | European Pat. Off. . |
| 0216523 | 4/1987 | European Pat. Off. . |
| 61-84549 | 4/1986 | Japan . |

OTHER PUBLICATIONS

Patent Abstracts of Japan, vol. 8, No.: 196 (P-299) (1633), 8-Sep.-1984, see FIGS. 8, 9 and JP, A, No. 5983039, (Yokogawa Kokushin Denki K.K.) 14--May-1984.

Primary Examiner—Michael J. Tokar
Attorney, Agent, or Firm—Oblon, Spivak, McClelland, Maier & Neustadt

[57] ABSTRACT

Gradient pulses are applied during the common periods and with homothetic shapes on each of three imaging axes of an NMR machine in order to form oblique images. This results in a simplification of programming of the supplies of the gradient pulse application device.

5 Claims, 2 Drawing Sheets

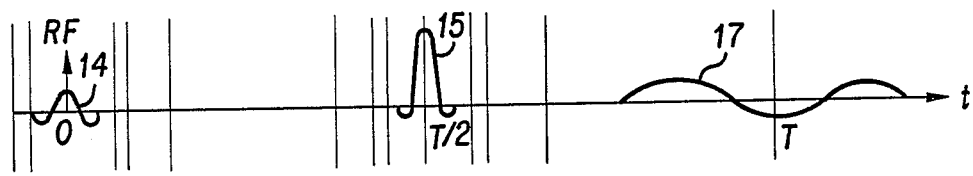
FIG. 2a
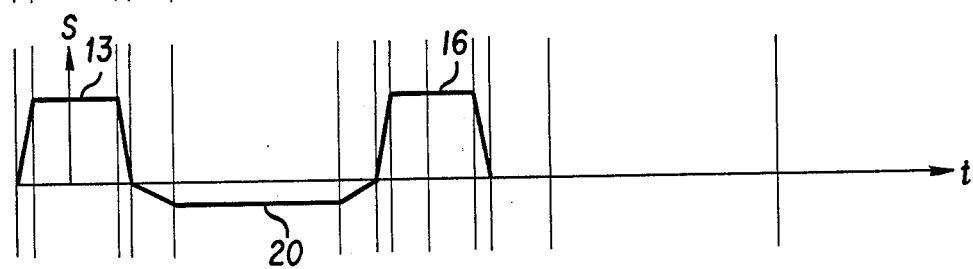
FIG. 2b
FIG. 2c
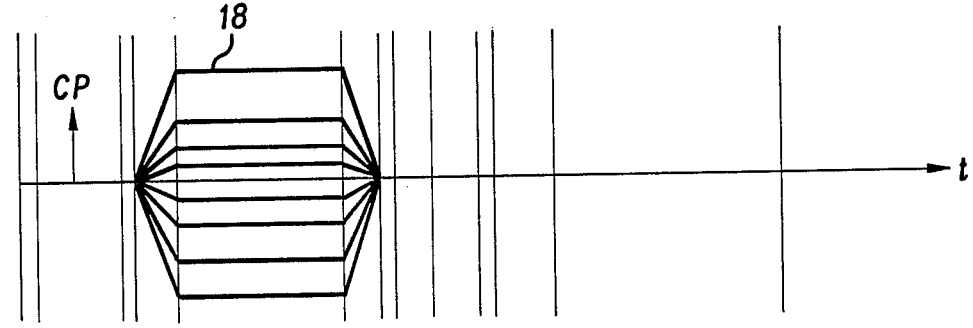
FIG. 2d
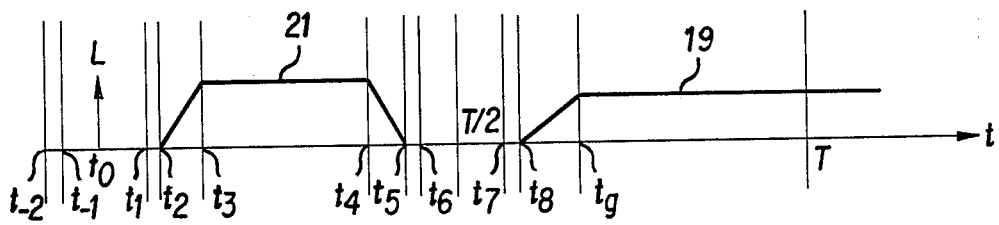
FIG. 2e
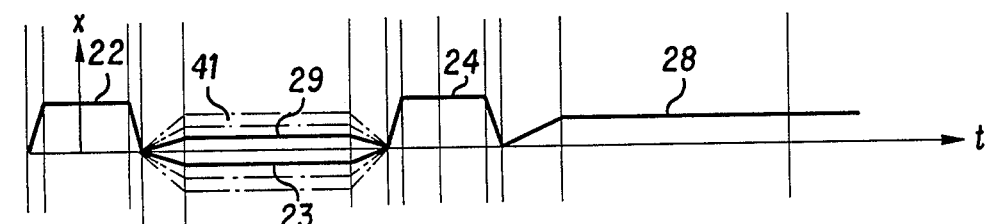
FIG. 2f
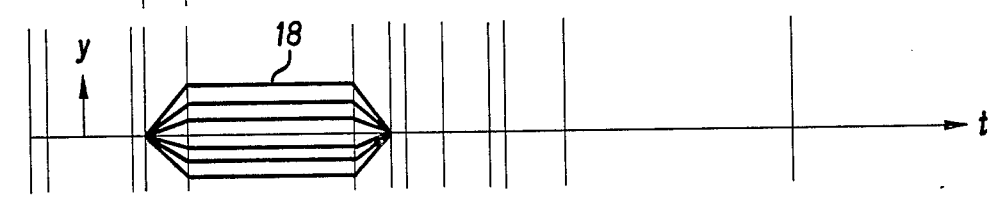
FIG. 2g
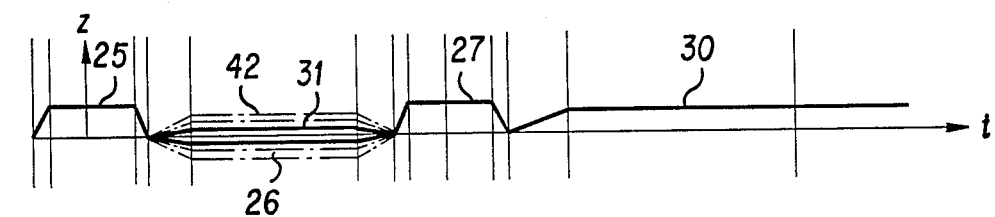

METHOD FOR THE APPLICATION OF GRADIENT PULSES IN AN IMAGING EXPERIMENT USING A NUCLEAR MAGNETIC RESONNANCE MACHINE

BACKGROUND OF THE INVENTION

1. Field of the Invention

An object of the present invention is a method to apply pulse gradients in an imaging experiment by means of a nuclear magnetic resonance (NMR) machine. The invention can be applied especially in the medical field where NMR imaging techniques are used as diagnostic aids. However, it can also be used in other fields, especially in industry, for non-destructive testing.

2. Description of the Prior Art

The phenomenon of nuclear magnetic resonance and the working principle of imaging machines, based on this phenomenon, are known. The NMR signal depends at each position in a field under examination by an imaging machine of this type on the orienting field of this imaging machine. To bring out the phenomenon, a body to be examined is excited with a radio-frequency excitation. A free precession decay signal from the body's particles, when they return to equilibrium, can be measured when their magnetic moment is re-oriented with the orienting field at the end of their flip which depends on the excitation. The excitation is applied to the entire body under examination and all the particles of the body may give out a free precession decay signal at its end. In fact, the rise of this phenomenon is distributed among selected sections of the body by local modification of the conditions of resonance. This modification is given by an additional magnetic encoding known as selection encoding.

The local resonance conditions are modified by increasing or decreasing the intensity of the orienting field in the selected section. For scientific and technological reasons, it is not possible to modify the intensity of a continuous magnetic field sharply on either side of a section of space. The modification of the field thus takes the form of a regular variation according to the abscissa of the positions of the space considered on an axis perpendicular to the section to be selected. Hence, the intensity of the orienting field is subjected, along this axis, to a gradient. In practice, the additional fields, added to the constant and homogenous fields throughout the space in order to provoke this variation are commonly called field gradients.

To create an image of a selected section, the free precession signal resulting from the excitation must also be subjected to other additional encodings before and during its measurement. The additional encodings applied before the measurement are called phase encodings. In a series of successive sequences, the encoding thus done is modified from one sequence to another. The resulting variations in the measured signal are interpreted to discriminate the image parameter as if they were projected on an axis parallel to the one along which these phase encodings are applied. When the de-excitation signal is being read, another encoding is further applied in the form of a so-called read gradient. This encoding tends to modify the resonance frequency of the resonance phenomenon according to the amplitude of the additional magnetic field thus provided. The result of this is that it is also possible to do a frequency discrimination in the signal received showing, at each sequence, the result of the projection of the image on another axis, parallel to the read gradient axis. By sampling the read signal at each sequence in the series, a set of samples forming a matrix is obtained. Calculating the Fourier transform along the rows and then the columns (or conversely) of the samples matrix gives the image. This image corresponds to that of the section selected by application of the selection gradient. This imaging mode requires the gradients to be pulsated: they are applied by pulse gradients.

Conventionally, magnetic coils to apply pulse gradients are set up on the machines so as cause the field gradients to be applied such that they are oriented fixedly with respect to the machine. These orientations are generally distributed along three mutually perpendicular axes, one of which is parallel to the orienting field (z) of the machine. If X, Y and Z are the imaging axes of the machine, the selection, phase encoding and read functions can be assigned to each of these three axes respectively to define transversal, sagital and frontal images of the body. More generally even the making of oblique images has been envisaged. In theory, making these images does not raise any special difficulties.

In practice, it is not so simple to make oblique images. For the selection, phase encoding and read gradient pulses have their own forms which cannot be transposed (to change the function of the machine's imaging axes) but which are difficult to associate owing to the very fact that there is a variety of forms and variation in encoding. In particular, as stated above, the phase encoding changes from one sequence to another in the series. Thus the combination, on an imaging axis of the machine, of a phase encoding pulse with a read pulse and/or a selection pulse amounts to defining complex forms of gradient pulses. This is all the ruer as the phase encoding pulses are variable in time. It becomes necessary, for example, to make pulses having a broadly staircase-like form with at least two steps where the height of one step varies from one sequence to another. It is difficult to programme power supplies of the gradient coils for these tasks. The result of this is that practitioners do not use oblique images, and this is detrimental to the quality of their diagnosis.

SUMMARY OF THE INVENTION

An object of the present invention is to cope with the above disadvantages by imposing identical forms and application periods on the field gradient pulses. The distribution of the different pulses among the imaging axes of the machine and their programming thus affects only their intensity.

An aim of the invention is a method for the application of gradient pulses in an imaging experiment using an NMR machine, said method comprising the following steps:

common forms are chosen for the gradient pulses that are likely to occur substantially at the same time;

common instants are chosen for applying the various gradient pulses to the various axes of the image;

and the gradient pulses, relating to the image, are distributed among the imaging axes of the machine, depending on the direction cosines of the inclination of the image with respect to the imaging axes of the machine, and according to a chronology determined by the choice of common instants.

BRIEF DESCRIPTION OF THE DRAWINGS

The invention will be better understood from the following description and the accompanying figures. These figures are given purely by way of indication and in no way restrict the scope of the invention. In particular, the description of a 2DFT type imaging method in no way limits the scope of the invention. Of the appended figures:

FIGS. 2a, 2b, 2c, 2e, 2f and 2g show timing diagrams of radio frequency signals and gradients used in the invention.

DESCRIPTION OF A PREFERRED EMBODIMENT

Figure 1:
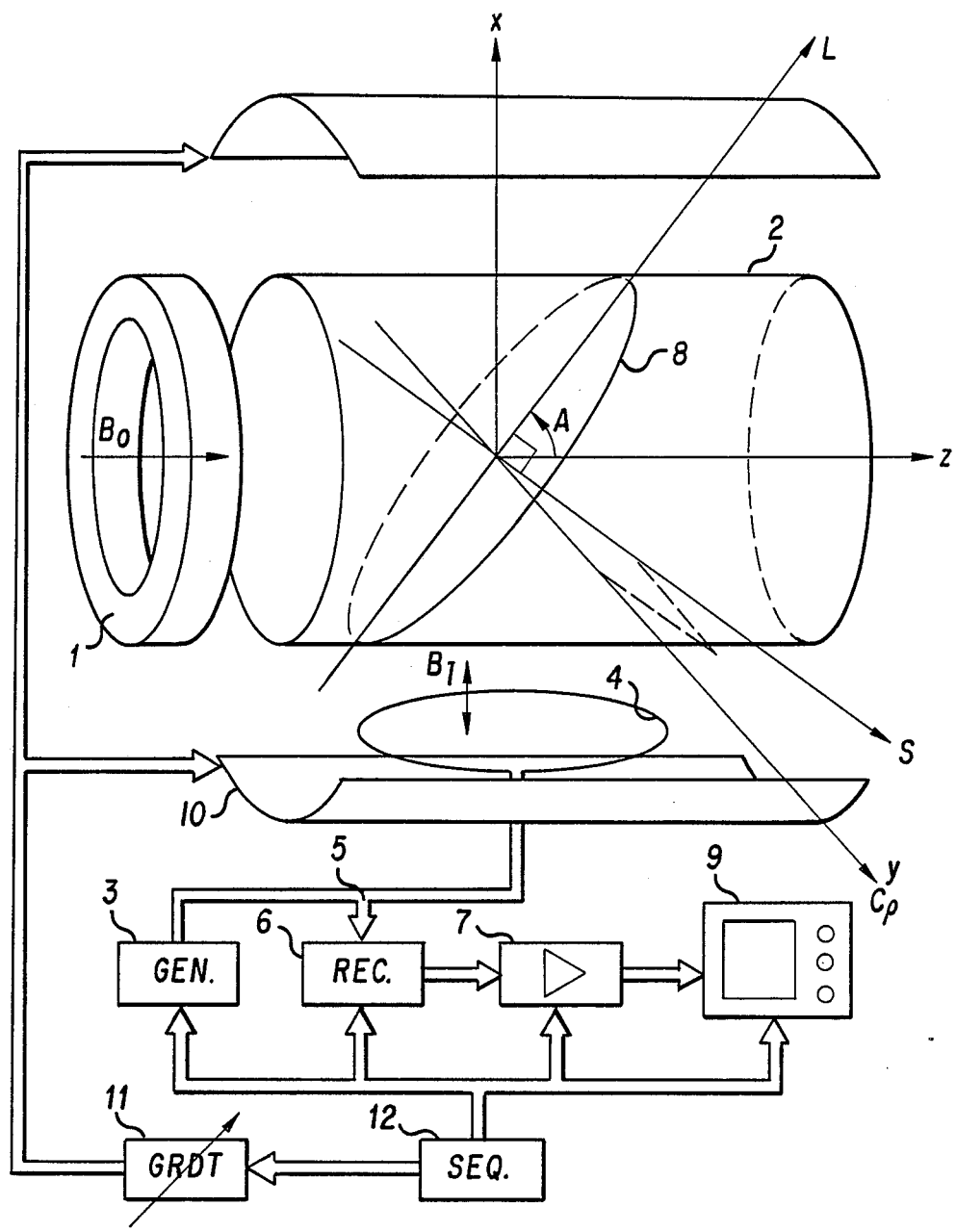
FIG. 1 shows a schematic view of an NMR imaging machine using the method of the invention.

FIG. 1 gives a schematic view of a nuclear magnetic resonance imaging machine. This machine essentially has devices 1 to produce a homogenous, constant orienting magnetic field $B_O$ in a place where a body 2 to be examined is located. The body 2 is subjected, in this place, to a radio-frequency excitation produced by a generator 3 working in cooperation with an antenna 4. The antenna is also used to pick up the free precessional decay signal and convey it, by means of a duplexer 5, to signal reception devices 6 and signal processing devices 7. At the end of the processing, the image of a section 8 of the body 2 may be displayed on a display device 9.

To subject the magnetic moments (and these moments only) of the protons of the body 2, located in the section 8, to the resonance phenomenon, and to enable the making of the image, gradient coils 10 have been used. These gradient coils 10 are supplied from a gradient pulse generator 11. All these devices work under the control of a sequencer 12. FIGS. 2a to 2d give a schematic view of the following signals respectively: the radio-frequency excitation and measurement signals RF, the selection gradient signals S, the phase encoding signals CP, and the read signals L to be applied to the body 2 to give an image of a section, inclined by an angle A (FIG. 1) with respect to the (orthogonal) imaging axes X, Y and Z of the machine. The sequence of the signals shown corresponds to a sequence relating to an imaging method of the 2DFT type with spin echo. According to this method, during the application of a selection gradient pulse 13 on a selection axis S, a radio-frequency excitation 14 is applied to the body 2. After a second radio-frequency pulse 15, called a 180° pulse, applied in the same way in the presence of another gradient pulse 16 for the selection of the same section 8 (applied on an instant T/2 after the application of the pulse 14), the free precessional signal 17 can be measured around an instant T. Between the two radio-frequency excitations, a pulse 18 of a phase encoding gradient is applied on an axis CP at each sequence of the series of sequences. The amplitude, the force, of this pulse 18 vary from one sequence to another. During the measurement and reading of the free precession signal, a read gradient pulse 18 is applied on a third image axis L. This read gradient pulse 19 causes frequency differentiation at the moment of reading.

For the phase encoding to be solely the encoding given to the phase encoding axis CP, the encoding pulses applied to the other axes must be compensated for. In particular, a pulse 20 with an integral, which is substantially equal to that of the pulse 13 but has the opposite sign, is applied at the end of this pulse 13 so as to eliminate any unwanted effect from it. The pulse 16 is self-compensated inasmuch as it is symmetrical in shape and duration around the instant T/2. Furthermore, the read pulse 19 is neutralized by a read pre-coding pulse 21, the integral of which is substantially equal to the integral of that part of the pulse 19 which is limited on the right-hand side by the echo time T and has the same sign as itself.

In the invention, it has been managed, essentially, that the pulses 18, 20 and 21 occur between identical instants. It has also been ensured that these pulses have forms that are homothetical with one another. The result of this is that each sequence has been split up into a number of pre-determined instants during which the gradient pulses are supposed to be applied. Thus the selection pulse is to be applied from the instant $t_{-2}$ to the instant $t_2$ at the first excitation and from the instant $t_5$ to the instant $t_8$ during the spin-echo excitation. Similarly, the pulses 18, 20 and 21 are applied between the instants $t_2$ and $t_5$. Furthermore, the pulses 18, 20 and 21 have an identical rising time extending between the instants $t_2$ and $t_3$, and an identical falling time extending between the instants $t_4$ and $t_5$. The only specific features that differentiate these pulses from one another are, firstly, the axes to which they are applied and, secondly, their respective intensities.

This feature can be used simply to divide the selection, phase-encoding and read pulses among each of the three imaging axes X, Y and Z, of the machine. In the example shown (and solely to simplify the explanation), we have chosen an oblique section 8, passing through the axis Y of the machine, which is at the same time the phase-encoding axis CP. In general, the axis CP is not colinear with the axis Y: the following explanation should be transposed to this case which is precisely where the invention contributes a major simplification. The read axis L is, for its part, colinear with the plane of the image while being perpendicular to the phase-encoding axis CP. The selection axis S is perpendicular to this image. The orientation of the selection axis S with respect to the imaging axes Y and Z can be determined depending on A. Consequently, the selection pulses 13, 20 and 16 should be divided into pulses 22 to 24 and 25 to 27, respectively on the X and Y axes of the machine. In the same way, the read pulses 19 and 21 are divided into pulses 28 and 29 and 30 and 31, respectively on the same axes. Inasmuch as they are antagonistic with one another, the pulses 23 and 29 and 26 and 31 may be simplified if necessary. On the contrary, the pulses 18 have been kept on the imaging axis Y because of the inclination sought for the section 8.

If we assume that, as is generally the case, the pulses 23 and 29 and 26 and 31 do not neutralize each other, the result is their pairs give rise, each time, to a gradient pulse with a form that is homothetical (barring the sign as the case may be) with the pulse 20 or the pulse 21 respectively. The result of this is that the devices needed to create these gradient pulses along the imaging axes of the machine are the same as those which could be used to create the gradient pulses when the images sought are not oblique with respect to these imaging axes. They are therefore known devices. It is only the applied intensities that change from one experiment to another. The result then is a particularly simple one which consists in making three copies, with identical structures, of devices to impose the various gradient pulses on each of the imaging axes. Now these devices, included in the sequencer, distribute programmed instructions to the generators 11 so as to produce gradient pulses of given forms and amplitudes at the outputs of these generators. Thus the distribution of the selection pulse 13 between two axes (X and Y here), or among three axes in the case of any inclination of the image, makes it necessary to execute programmes of the same type to apply the pulses to the same three axes between the instants $t_{-2}$ and $t_2$, $t_5$ and $t_8$, and after $t_8$. On the same basis, the distribution of the phase encoding CP among the three axes X, Y, Z also requires three programmes of the same type to deliver these pulses between $t_2$ and $t_5$. All this can be done simply by modifying the software of the sequencer.

It can be seen that, in the invention, the making of oblique images requires only the devices that are supposed to be needed in theory. For, with both the same predetermined instants and the same pulse forms, only the intensities of the pulses have to be determined at each sequence and for each pulse. These intensities depend on the direction cosines of the inclination A of the image with respect to the imaging axes X, Y, Z of the machine. The invention further has the specific feature wherein the pulses all have the same rising ($t_{-2}t_{-1}$; $t_2 t_3$ and $t_5 t_6$) and falling times. They all have a generally trapezoidal form. Finally, in a preferred manner, the programmes are prepared so that, to the extent possible, a pulse gradient begins as soon as another one is ended. There is no idle time. The diagrams 2e and 2g show this very clearly: the pulses are contiguous. In fact, the diagrams correspond here to a minimum echo time T. If the echo time is not minimum, there is a gap between the end of phase encoding pulses 18, 23, 26, 29, 31 and the start of the re-selection pulses 24, 27.

In the general example of any inclination whatsoever in the image, the phase encoding pulse is, of course, also divided, variably from one sequence to another in the series, into variable pulses 41 and 42 on the other imaging axes.

What is claimed is:

1. A method for the application of electrical gradient pulses in an imaging experiment using an NMR machine, said machine comprising gradient coils, said gradient coils being supplied by aid electrical gradient pulses, said gradient coils being distributed in three sets, each of said three sets being involved in providing magnetic field pulses whose values vary linearly as a function of an abscissa measured on one of the three axes of an intangible three dimensional reference bound to said machine, said experiment comprising the steps of:
   performing a temporal exciting-measuring sequences for sequentially exciting a body to be examined in said machine by a radio frequency excitation while submitting said body to said magnetic field pulses and measuring excitation radio frequency signals emitted by said body,
   reconstructing a computerized structure corresponding to said body from said measurements,
   said computerized structure being expressed as a collection of data, each data corresponding to a voxel of said body, each data comprising a magnetic information and an address information,
   said address information representing the coordinates of said voxel with regard to imaging axes, said imaging axes being inclined with regard to said reference axes, and
   making an image of said body from said reconstruction, said method comprising the following steps:
   separating said electrical gradient pulses into strength components of said magnetic field pulses distributed over the reference axes of said machine, said strength components being a function of direction cosines of the inclination of said imaging axes with respect to said machine reference axes,
   choosing common homothetic forms for the evolution in time for gradient pulses that are applied to said gradient coils substantially at the same time during said sequences of said experiment;
   choosing common instants during said sequences for the temporal application of said electrical gradient pulses.

2. A method according to claim 1 wherein the imaging experiment comprises the application of a 2DFT type imaging method, wherein said imaging axes are a selection axes, a phase encoding axis and a read axis of said 2DFT type method and wherein the reference axes of the machine are mutually orthogonal, one of said reference axes being oriented in the same direction as an orienting magnetic field needed for experiment.

3. A method according to claim 2 wherein, in each sequence, the application of said gradient pulses has four typical steps: a first step for image selection, a second step for selection re-phasing, phase encoding and read pre-coding; a third selection step and a fourth read step, the first and second steps and the third and fourth steps being respectively contiguous with each another in time.

4. A method according to any one of the claims 1 to 3 wherein a generally trapezoidal form is chosen for the evolution in time of the pulses.

5. A method according to any one of the claims 1 to 3 wherein, for distribution of the gradient pulses, action is taken only with respect to the amplitude of the pulses.

* * * * *